(12) United States Patent
Düppre et al.

(10) Patent No.: US 11,862,947 B2
(45) Date of Patent: Jan. 2, 2024

(54) SWITCH CABINET ARRANGEMENT

(71) Applicant: WIPOTEC Science & Innovation GmbH, Kaiserslautern (DE)

(72) Inventors: Theo Düppre, Kaiserslautern (DE); Steffen Hager, Mehlingen (DE)

(73) Assignee: Wipotec Science & Innovation GmbH, Kaiserslautern (DE)

( * ) Notice: Subject to any disclaimer, the term of this patent is extended or adjusted under 35 U.S.C. 154(b) by 186 days.

(21) Appl. No.: 17/553,775

(22) Filed: Dec. 16, 2021

(65) Prior Publication Data

US 2022/0200249 A1  Jun. 23, 2022

(30) Foreign Application Priority Data

Dec. 18, 2020 (DE) .......................... 102020134288.8

(51) Int. Cl.
| | |
|---|---|
| *H02B 1/38* | (2006.01) |
| *H05K 5/06* | (2006.01) |
| *H05K 7/18* | (2006.01) |
| *H02B 1/30* | (2006.01) |
| *H05G 1/02* | (2006.01) |

(Continued)

(52) U.S. Cl.
CPC .............. *H02B 1/38* (2013.01); *H05K 5/061* (2013.01); *H05K 7/18* (2013.01)

(58) Field of Classification Search
CPC . H02B 1/38; H02B 1/30; H02B 1/308; H02B 1/52; H02B 1/565; H05K 5/061; H05K 7/18; H05G 1/02
See application file for complete search history.

(56) References Cited

U.S. PATENT DOCUMENTS 1,241,615 A * 10/1917 Farrow ..................... E05G 1/00
312/409
4,240,222 A * 12/1980 Covington ............. A01K 97/06
206/315.11

(Continued)

FOREIGN PATENT DOCUMENTS

AT           2350 U1   8/1998
DE    202009014666 U1   3/2010
(Continued)

OTHER PUBLICATIONS

Branchenkisungen, rittal das system, Apr. 1, 2011 URL:http://www.guh-elektro.de/fileserver/henrich/files/4415.pdf.

(Continued)

*Primary Examiner* — Hoa C Nguyen
*Assistant Examiner* — Amol H Patel
(74) *Attorney, Agent, or Firm* — The Culbertson Group, P.C.

(57) ABSTRACT

An apparatus includes a switch cabinet and a device housing. The device housing is adapted to accommodate a component of a device and the switch cabinet is adapted to accommodate electrical equipment for the device. The switch cabinet is operable to be moved between an open position and a closed position relative to the device housing. When in the closed position a wall of the switch cabinet closes off an opening in the device housing, and when in the open position the wall of the switch cabinet is removed from the opening in the device housing so as to expose that opening.

15 Claims, 3 Drawing Sheets

(51) Int. Cl.
*H02B 1/52* (2006.01)
*H02B 1/56* (2006.01)

(56) References Cited

U.S. PATENT DOCUMENTS

| | | | | |
|---|---|---|---|---|
| 4,844,565 A | * | 7/1989 | Brafford | H02B 1/308 |
| | | | | 312/111 |
| 4,978,001 A | * | 12/1990 | Nelson | A47B 46/00 |
| | | | | 248/222.52 |
| 2007/0184339 A1 | * | 8/2007 | Scheucher | B60L 15/20 |
| | | | | 211/13.1 |
| 2008/0040885 A1 | * | 2/2008 | Daoud | H04Q 1/025 |
| | | | | 16/221 |
| 2010/0156253 A1 | | 6/2010 | Ohfuchi et al. | |
| 2014/0111075 A1 | * | 4/2014 | Schneider | H02B 7/06 |
| | | | | 312/223.1 |
| 2020/0072725 A1 | | 3/2020 | Colclough | |
| 2021/0041408 A1 | * | 2/2021 | Dickow | H05K 7/16 |

FOREIGN PATENT DOCUMENTS

| | | |
|---|---|---|
| DE | 202020104233 U1 | 8/2020 |
| EP | 0748017 A2 | 12/1996 |
| JP | H02156905 A | 6/1990 |

OTHER PUBLICATIONS

Rittal "VX25 Brochure—Armoires électriques", Jul. 19, 2018 URL:https://www.rittal.com/com_en/vx25/downloads/vx25_broschuere_fr.pdf.
EP21215396.9 European Patent Office extended European search report dated May 16, 2022.
Japanese Patent Office Action dated Oct. 26, 2022 in Japanese patent application JP2021205059A.

\* cited by examiner

SWITCH CABINET ARRANGEMENT

TECHNICAL FIELD OF THE INVENTION

The present invention relates to a switch cabinet for receiving electrical installations for joint arrangement with a device housing.

BACKGROUND OF THE INVENTION

The electrical equipment (control devices, power adapters, contactors, etc.), of devices or machines is typically arranged in housings. The term "housing" in this regard is to be understood as a device which surrounds an interior space at least partially, preferably completely, with the objective of protecting the space from external influences. The protection can relate both to mechanical effects and to the ingress of solids, liquids, or gases. The suitability of a housing for the respective protection sought can be designated by the housing protection class. An X-ray inspection device having the housing protection class IP 69, for example, is especially well protected against external influences.

Housings for machines and devices will be referred to hereinafter for the sake of simplicity as device housings. They are generally provided with an access restriction as a protection for operating personnel. This is intended to ensure that parts carrying electrical voltage are not inadvertently touched and do not come into contact with liquids and contaminants. To this end, the device housing generally has a housing opening closable by a cover, flap or housing door, through which the interior of the device housing along with the electrical components located therein can be reached. The device housing should be sealed on all sides to the maximum extent, and any openings must be arranged and protected such that dangerous parts carrying current cannot be reached from the exterior.

Some devices such as X-ray inspection devices are operated with fluids (flowable media such as air/compressed air, hydraulic fluid or other fluids). These fluids can serve as lubricants or more particularly, as coolants for cooling an X-ray source. In this case, special attention must be paid to the interior of the housing in order to prevent contact of the fluids with voltage-carrying parts to protect the operating personnel or to prevent the occurrence of short circuits or fires. As a rule, it is attempted to arrange the fluid circuits within the housing in sections (compartments) strictly (hermetically) separated from the electrical equipment, for which the legal provisions or the standards to be complied with can vary from country to country.

It is thus conceivable that stricter requirements may be applicable in the user's country than in the manufacturer's country so that, for example, the arrangement of fluid circuits and electrical equipment within a single housing is still permissible for the manufacturer, while operation of the device is only allowed in the user's country if the electrical equipment is hermetically separated in a separate switch cabinet. The required elevated operating safety of the device is often evaluated and certified by testing organizations in testing laboratories. Devices without an appropriate certificate are then not accepted by the user or the respective legal authorities.

If the elevated requirements already exist during the development or construction of the device, or if the requirement only arises subsequently, for example due to amended legal requirements or new generally recognized standards or as part of a renovation or expansion, then suitable measures must be taken in each case in order to satisfy the new requirements. Proceeding from the previous configuration of the device, a further development or retrofit of the device should be as simple and cost-effective as possible.

SUMMARY OF THE INVENTION

The problem addressed by the invention was therefore that of offering a modularly expandable, cost-effective housing protection concept which enables a scalable protection level and easy subsequent certification. The problem is addressed in accordance with the present invention with a switch cabinet adapted to be arranged with a device housing.

According to one aspect of the invention, electrical equipment for a device or machine component contained in the device housing is accommodated in a switching cabinet separate from the device housing. In a particularly practical implementation of this aspect of the invention, the switch cabinet takes on a double function, firstly by sealing the electrical equipment arranged in the interior with respect to the device housing, and secondly by closing off the device housing at the same time.

For accommodating electrical equipment, the switch cabinet according to the invention has a switch cabinet interior to be delimited from or sealed with respect to the surroundings, wherein the delimitation comprises at least one switch cabinet wall. This can be a rear wall of the switch cabinet, for example, which is preferably planar. The wall may be immovable relative to the switch cabinet or the switch cabinet interior. It may be fixedly connected to a switch cabinet frame or to other parts of the switch cabinet housing. According to the invention, the switch cabinet is designed to close off a housing opening in a device housing adjacent to the switch cabinet by means of the switch cabinet wall. The housing opening can be provided, for example, on the rear side of the device housing to ensure access to the housing interior. With a switch cabinet according to the invention, it is especially easily possible (even retroactively) to create a space for electrical equipment separated from the device housing in order to be able to meet increased safety and certification requirements or a required housing protection class thereby.

For example, in an X-ray inspection device, hoses, pumps or other components and conduits carrying fluids are initially accommodated together with the electrical equipment in the device housing. Due to special safety requirements and/or to achieve a special certificate, however, it becomes necessary for certain users to remove the electrical equipment partially or completely from the device housing and to arrange the equipment hermetically sealed with respect to the housing, for example. The switch cabinet according to the invention makes it possible firstly to take the electrical equipment from the device housing, and secondly to close off the aforementioned housing opening toward the device housing by means of the switch cabinet wall, which enables access to the components remaining in the device housing when the switch cabinet wall or the switch cabinet is removed. The switch cabinet then forms a modular extension of the device housing.

Re-equipping and subsequent handling of the X-ray inspection device thereby becomes particularly easy. A door for the above-mentioned housing, which closed off the housing opening prior to re-equipping, is replaced by the wall of a switch cabinet according to the invention, which is pivotable or movable relative to the housing opening in order to selectively enable or securely prevent access to the housing interior through the housing opening. In an open position, in which the switch cabinet along with the wall thereof is removed, the components remaining in the device housing are accessible for installation, maintenance or repair work, for example. In the closed position, in which the wall of the switch cabinet closes off the housing opening (preferably hermetically), the wall can effect the desired separation of the components in the device housing from the electrical equipment, which is now arranged in the switch cabinet. The switch cabinet wall satisfies a double function according to the invention because it both seals and separates the housing interior and the switch cabinet interior.

The above-mentioned re-equipping of a device (for example in order to remove electrical equipment from the device housing), or in general the modular expansion of a device housing, can then be accomplished easily by removing the housing door and providing a switch cabinet according to the invention in place of the housing door, the switch cabinet then receiving the electrical components to be transferred from the device housing and being designed to tightly close the housing opening in the closed position in place of the housing door. The switch cabinet in this arrangement is positioned as an expansion module particularly close to the device housing and unnecessarily long electrical connections between the switch cabinet and the device housing are not required.

At the same time, the wall of the switch cabinet, which separates the interior of the device housing from the interior of the switch cabinet, can also have suitable cable bushings to enable electrical connection from the switch cabinet into the device housing. It is not necessary to route conduits outside the combination formed by the device housing and the switch cabinet for installation or re-equipping. The cable bushings and the contact area between the wall and the device housing are sealed in such a way that the increased safety requirements are satisfied and the passage of dirt, dust, liquids or gases, for example, from the device housing through the wall into the interior of the adjacent switch cabinet is prevented.

An arrangement according to the invention of the device housing and the switch cabinet housing may be configured so that the switch cabinet itself can remain closed even if it is moved relative to the device housing, in order to separate from and expose the housing opening for example. In these embodiments, the desired protection for the components arranged in the device housing exists independently of whether the interior delimited by the switch cabinet is itself open to access or closed.

Some embodiments of the invention provide the establishment of at least one electrical connection between the switch cabinet and the device housing by manually detachable plug connections. Thereby the switch cabinet and the electrical equipment thereof can be easily separated from the device housing for performing maintenance or repair work, for example. An alternative embodiment provides that the electrical connection is automatically established upon assumption of the closed position, and is automatically disconnected when the switch cabinet is moved into the open position. This can be accomplished by means of suitable two-part, preferably complementary plug connections, the parts of which are arranged on the device housing on the one hand and on the switch cabinet on the other, and cooperate with one another when the closed position is assumed.

The switch cabinet according to the invention may be designed to seal the housing opening of the device housing hermetically, particularly against the passage of gases and liquids. This can be accomplished in that the wall of the switch cabinet that closes off the housing opening has suitable means to achieve this sealing. For example, the wall can have a defined profile, sealing means or fittings which are designed to cooperate in the closed position with the device housing in the region of the housing opening. Embodiments of the invention may also include tensionsing means on the switch cabinet (apart from the wall), which can cooperate with suitable tensioning means on the device housing in order to move the switch cabinet together with the wall thereof in the closed position against the housing opening and to tension and/or lock the switch cabinet wall against the periphery of the housing opening.

A switch cabinet according to the invention can be designed in different ways to be moved along with the wall thereof out of the closed position, which closes off the housing opening, into the open position, which releases (separates from) the housing opening, and back again. Thus the switch cabinet can be pivoted about a preferably vertical or horizontal pivoting axis for example, wherein the wall of the cabinet closes off the housing opening in one pivoted position and opens it in another. The switch cabinet could be fastened permanently or detachably for this purpose by guide structures in the form of hinges on the device housing. Alternatively, the switch cabinet could have means with which it can be moved parallel to the cabinet wall in front of or away from (perpendicularly from) the housing opening, depending on the type of sliding door. For example, a switch cabinet in accordance with the invention may have or use a guide structure such as a guide rail (preferably having an end stop) which enables or controls this movement relative to the housing or the housing opening. Other guide structures could also be provided in order to facilitate movement of the switch cabinet perpendicularly in a controlled manner toward or away from the housing opening.

Another aspect of the invention also relates to a device housing of the type mentioned above which is designed to close off the device housing thereof by means of the wall of a switch cabinet according to the invention as previously described. The device housing can be suitable for this purpose in that the housing opening is closable selectively either by a housing door provided for the device housing or by the wall of a switch cabinet according to the invention. The device housing could alternatively have means for interacting in a targeted manner with the wall of a switch cabinet according to the invention in order to assume the closed position. The device housing could also be suitable due to suitable fittings to fix a switch cabinet according to the invention or the rear wall thereof in the closed position on the device housing.

An arrangement according to the invention comprises a device housing and at least one switch cabinet of the type mentioned above and is characterized in that the device housing and the switch cabinet are designed to interact with one another in such a manner that the wall of the switch cabinet can close off the housing opening in a targeted manner (and preferably hermetically). The switch cabinet could be fastened via a hinge to the device housing such that it is pivotable relative to the device housing in order to selectively release or close off the housing opening. Guide rails or other suitable guide means that control the relative movement of the switch cabinet and the device housing between the open position and the closed position may also be used in some embodiments of the present invention.

A switch cabinet according to the invention may have a switch cabinet opening on one side (preferably opposite from the wall) which can be closed off in a suitable manner by a switch cabinet door. The interior of the switch cabinet is accessible via this door and prohibits access to the switch cabinet by unauthorized persons when the switch cabinet door is closed. The wall of the switch cabinet that closes off the housing opening may be the rear side thereof, while the switch cabinet door is opposite therefrom and forms the front side of the switch cabinet.

A modular extension of the device housing can also be applied to two switch cabinets. Thus a switch cabinet door of a first switch cabinet can be replaced by the wall or rear wall of a second switch cabinet which is positioned in front of the first switch cabinet to close off the latter, in place of the switch cabinet door of the first switch cabinet. In this way, a switch cabinet or the arrangement according to the invention of a device housing with an associated switch cabinet can be further extended in a modular or cascading manner. With two directly adjoining switch cabinets, arranged for example one after another, of such an arrangement, the (rear) wall of one (front) switch cabinet closes off the (front) switch cabinet opening of the adjoining other (rear) switch cabinet, which can then forgo a switch cabinet door.

If two successively arranged switch cabinets are sealed hermetically, i.e. largely gas-tightly and liquid-tightly, by the intermediate wall, it is also conceivable to arrange components which are subject to liquids or gases in one switch cabinet component, while the adjoining switch cabinet receives electrical equipment isolated therefrom, similarly to the above described "device housing—switch cabinet" combination.

Some embodiments of an arrangement according to the invention provide that the switch cabinet has a switch cabinet door for closing off a switch cabinet opening. The switch cabinet opening or the associated switch cabinet door preferably lies opposite from the wall of the switch cabinet such that the wall forms the rear wall of the switch cabinet, while the switch cabinet door closes off the switch cabinet opening on the front side of the switch cabinet. The device housing, or the housing opening thereof, in such an embodiment is designed such that, in place of the wall of a switch cabinet to be removed, the switch cabinet door thereof can be used to close off the housing opening of the device housing; the door "fits" both openings and thus may be thought of as a system door. The alternative usability of the switch cabinet door (system door) both for the switch cabinet opening and for the housing opening can arise, for example, if:
  a) the geometrical dimensions of both openings largely coincide, and/or
  b) the fittings for arranging the door on both openings are identical, and/or
  c) the door is provided with different fastening means, of which some are usable for fastening the door to the switch cabinet opening and others for fastening the door to the housing opening.

The above-described double usability of the door facilitates the modular extension or reduction of an arrangement according to the invention by one or more (preferably identical) switch cabinets. For example, if the device housing of an X-ray inspection device is to be extended by a switch cabinet for the first time, then the door with which the housing opening of the X-ray inspection device had previously been closed can be transferred to the front side of the switch cabinet to be additionally provided, in order to close off the switch cabinet opening there. The housing opening of the X-ray inspection device is instead closed off in the manner according to the invention by the wall of the added switch cabinet. If additional switch cabinets are added, the door is transferred correspondingly to the switch cabinet opening of the frontmost switch cabinet, while the switch cabinet openings of the individual switch cabinets therebetween are closed off by the wall of the respective next switch cabinet arranged in front of the switch cabinet.

Conversely, in an arrangement according to the invention having a device housing and one or more switch cabinets arranged in front of the device housing, one or more of these switch cabinets can be removed, wherein the switch cabinet door can be arranged on the switch cabinet opening exposed in the process (if at least one switch cabinet remains in the arrangement) or on the housing opening (if only the device housing remains after the re-equipping).

An embodiment of this kind, having a door (system door) which fits both the housing opening and a switch cabinet opening, advantageously reduces the expense for storage and the number of parts to be kept on hand, because the door, the seal thereof and the fittings can be used for both applications.

An arrangement according to the invention, composed of a device housing and at least one switch cabinet cooperating therewith, may be designed such that the switch cabinet in the closed position, i.e. when the wall thereof closes off the housing opening, can be locked to the housing by suitable locking means, which can also comprise a key. This key is preferably a switch cabinet key with which a switch cabinet door can also be locked. A plurality of directly adjoining switch cabinets, each of which closes off a switch cabinet opening of an immediately adjacent further switch cabinet in the manner described above, can also be locked to one another by means of such a switch cabinet key. In a practical manner, one key is sufficient, with which both the switch cabinet door of the frontmost switch cabinet and also, for example, two adjoining switch cabinets and a switch cabinet covering the housing opening of the device housing can be locked in the closed position. Alternatively, different keys or access means can be provided, which are linked to different access rights, so that unlocking or accessing the housing opening requires a different key than that for unlocking or accessing a switch cabinet opening.

In an arrangement having a device housing and one or more switch cabinets, the weight of the switch cabinets must be safely absorbed. For this purpose, the switch cabinets can be provided with feet or rollers of their own for example, in order to be movable or displaceable relative to the device housing or other switch cabinets while supported on the floor. A switch cabinet may alternatively be suspended on the device housing or on an adjoining further switch cabinet and is pivotable relative thereto in the nature of a door, the weight of which is absorbed by the adjoining housing. The entire (connected) arrangement is then easier to move, for a change of the installation site for example, than the device housing with multiple individually supported switch cabinets.

These and other advantages and features of the invention will be apparent from the following description of representative embodiments, considered along with the accompanying drawings.

DESCRIPTION OF REPRESENTATIVE EMBODIMENTS

Figure 1:
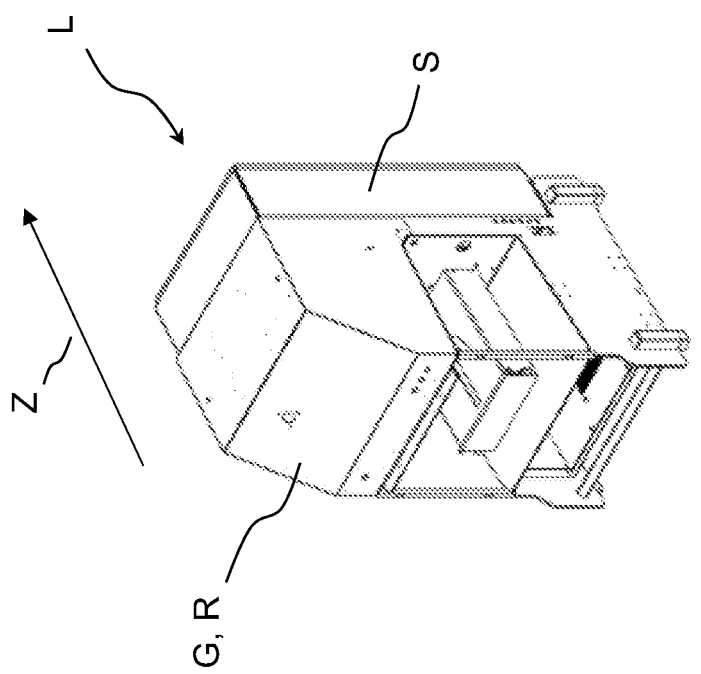
FIG. 1 shows an arrangement according to the invention in a first perspective with the switch cabinet in the closed position.

FIG. 1 shows a simplified perspective view of an X-ray inspection device R having a device housing G which rests on an underlying surface not shown in detail. The device housing G accommodates in the housing interior I (see FIG. 2) components of the X-ray inspection device R not shown in detail, which can include for example components such as an X-ray tube to which a coolant is applied, a chiller, a dehumidifier, a cooling device and associated tubes or hoses. In a depth direction Z, a switch cabinet S directly adjoins the device housing G to form an arrangement L. The switch cabinet S encloses a switch cabinet interior M (see FIG. 3) which is provided for accommodating electrical equipment not shown in detail, which is required for operating the X-ray inspection device R. In order to meet special safety requirements, the interior M of the switch cabinet S is hermetically separated from the housing interior I of the X-ray inspection device R. For this purpose, the switch cabinet S comprises a wall W forming the rear wall thereof, as illustrated in FIG. 2.

Figure 2:
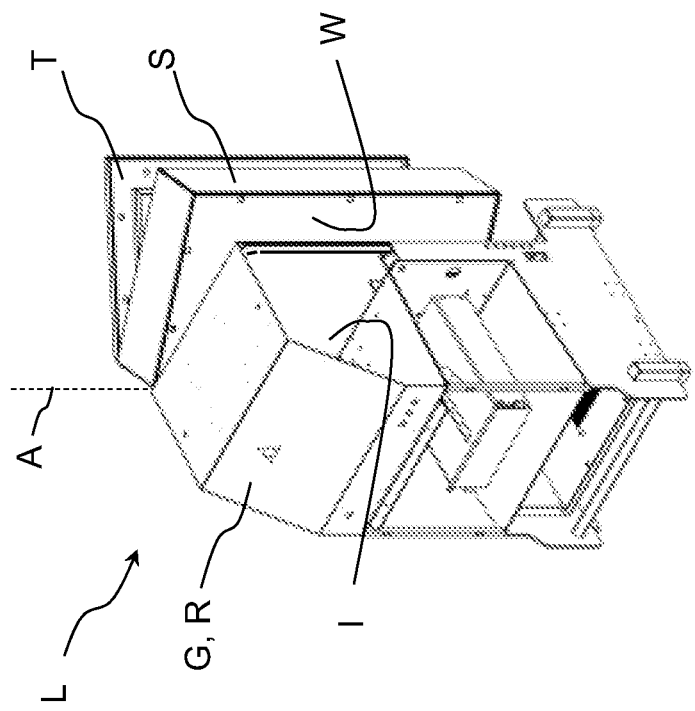
FIG. 2 shows the arrangement of FIG. 1 from the same perspective as in FIG. 1 but with the switch cabinet in an open position.
Figure 4:
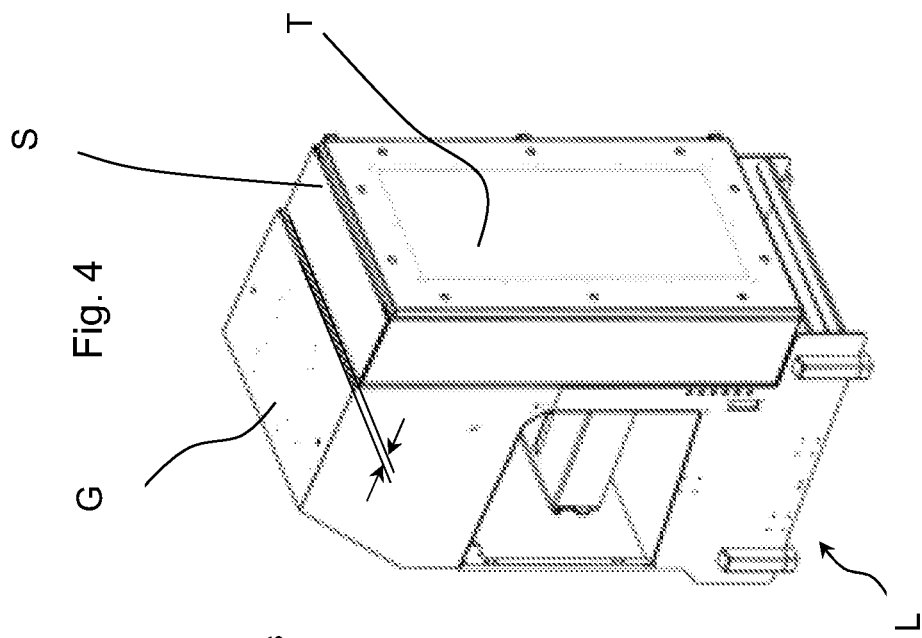
FIG. 4 shows the arrangement of FIG. 1 from the same perspective as FIG. 3 but with the switch cabinet in the closed position.
Figure 3:
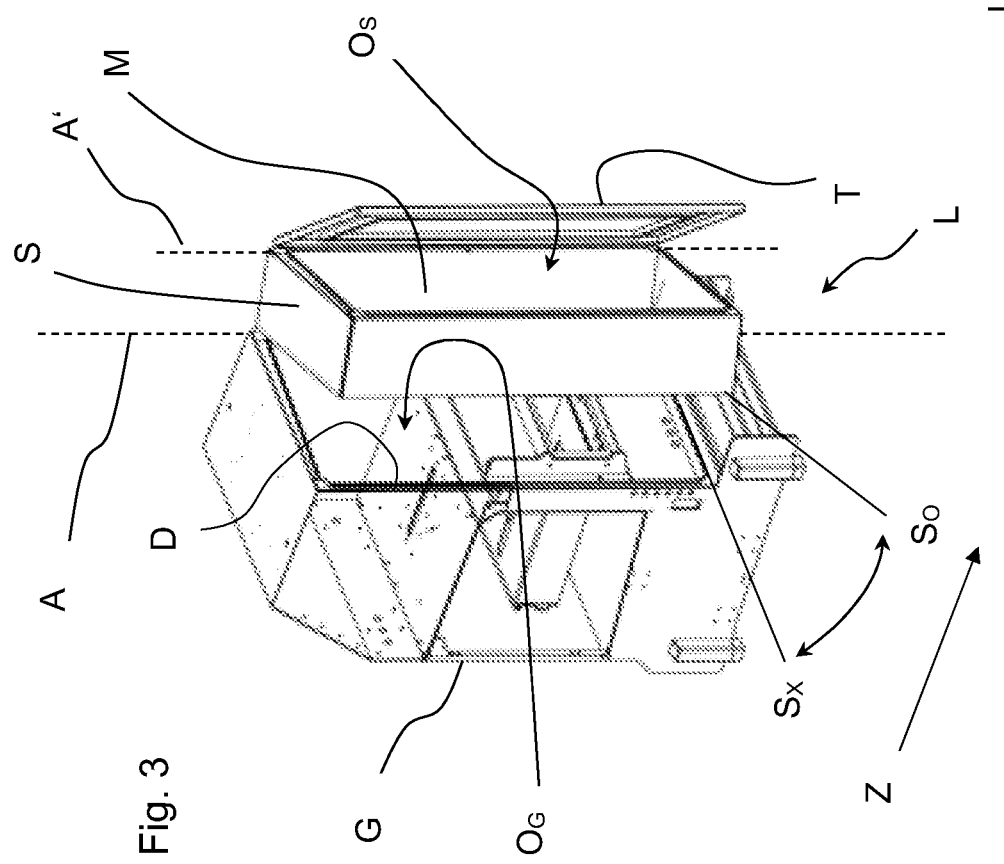
FIG. 3 shows the arrangement according to FIG. 1 from a different perspective and with the switch cabinet in an open position.

On a front side, remote from the wall W and accessible to operating personnel, the switch cabinet S is closed off by a switch cabinet door T, which is shown in a slightly opened position in FIGS. 2 and 3 and in a closed position in FIG. 4.

As illustrated particularly in the perspective view in FIG. 3, the device housing G has a housing opening $O_G$, through which the housing interior I is accessible, in the rear side of the device housing facing the switch cabinet S. To close off the housing opening $O_G$ and thus the housing interior I relative to the surroundings, the switch cabinet S is pivotable relative to the device housing G about a vertical pivot axis A as shown in FIG. 3 between an open position $S_O$ and a closed position $S_X$. The switch cabinet S in the closed position $S_X$ is represented in FIGS. 1 and 4 while FIGS. 2 and 3 show the switch cabinet S the open position $S_O$. In the closed position, the wall W of the switch cabinet closes off the housing opening $O_G$ completely and hermetically such that, for example, liquid or gaseous coolant cannot penetrate through the housing opening $O_G$ into the surroundings, especially into the switch cabinet S. The sealing is supported by a seal D which is provided at the rim of the housing opening $O_G$ in the device housing and runs completely around the periphery of the opening, which seal is pressed against by the wall W of the switch cabinet S when the switch cabinet is in the closed position.

In the open position $S_O$ shown in FIGS. 2 and 3, on the other hand, the housing interior I of the X-ray inspection device R is accessible (the open position $S_O$ shown is only selected for the sake of example). Although this position offers access to the housing interior I even with the small opening angle shown, this access can be further improved by further pivoting of the switch cabinet S away from the housing opening. Depending on how the linking of the switch cabinet S to the device housing G in the region of the pivot axis A is designed, the switch cabinet S can be pivoted from the closed position, even by more than 90°, to allow nearly unhindered access to the housing interior I.

FIG. 3 also shows that the switch cabinet S has a switch cabinet opening $O_S$, which leads into the switch cabinet interior M. The switch cabinet opening lies opposite the wall W of the switch cabinet and can be closed off by the switch cabinet door T. For that purpose, the switch cabinet door T is arranged on the frame of the switch cabinet S such that it can be pivoted relative to the frame of the switch cabinet S about the pivot axis A' parallel to the pivot axis A. Both pivot axes A, A' are on the same side of the arrangement L so that (in a view of the arrangement L from above) both the switch cabinet S and the switch cabinet door T thereof can each be pivoted counterclockwise in order to open the respective opening $O_G$, $O_S$. Alternatively it is also possible, however, to arrange the pivot axes alternately offset on the one and the other side of the arrangement L, for example, such that the opening movements take place alternately clockwise and counterclockwise.

The housing opening $O_G$ of the X-ray inspection device R has the same dimensions as the switch cabinet opening $O_S$. At the same time, the switch cabinet door T is designed to be fastened directly to the device housing G rather than to the frame of the switch cabinet, such that the housing opening $O_G$—if the switch cabinet S can be forgone—can also be closed off with the switch cabinet door T transferred directly from the switch cabinet S to the device housing, rather than with the wall W of the switch cabinet S. The housing opening $O_G$ and the switch cabinet opening $O_S$ are designed identically for this purpose. The switch cabinet door T in this case could also be referred to as a system door because it can close off the device housing G or the switch cabinet S selectively, depending on the installation. Conversely, it is evident that a system door previously covering the housing opening $O_G$ can be transferred instead to the front side of the switch cabinet S after interpolation of a switch cabinet S, in order to selectively close off or release the switch cabinet opening $O_S$.

It becomes clear from FIGS. 1 to 4 that the device housing G can be modularly extended or reduced with the aid of the switch cabinet S in a simple manner. An X-ray inspection device R initially formed without a supplementing switch cabinet S can be easily re-equipped by arranging the switch cabinet S in the manner shown in order to move certain components from the housing interior I of the X-ray inspection device R into the adjoining switch cabinet S and thereby separate them from the housing interior. Instead of providing an autonomous switch cabinet to be positioned separately for this purpose, the switch cabinet S is arranged according to the invention on the device housing such that it separates the housing interior I by means of the wall W from the switch cabinet interior M in the closed position. The wall W fulfills a double function in this case, because it seals and separates both the housing interior and the switch cabinet interior.

Figure 5:
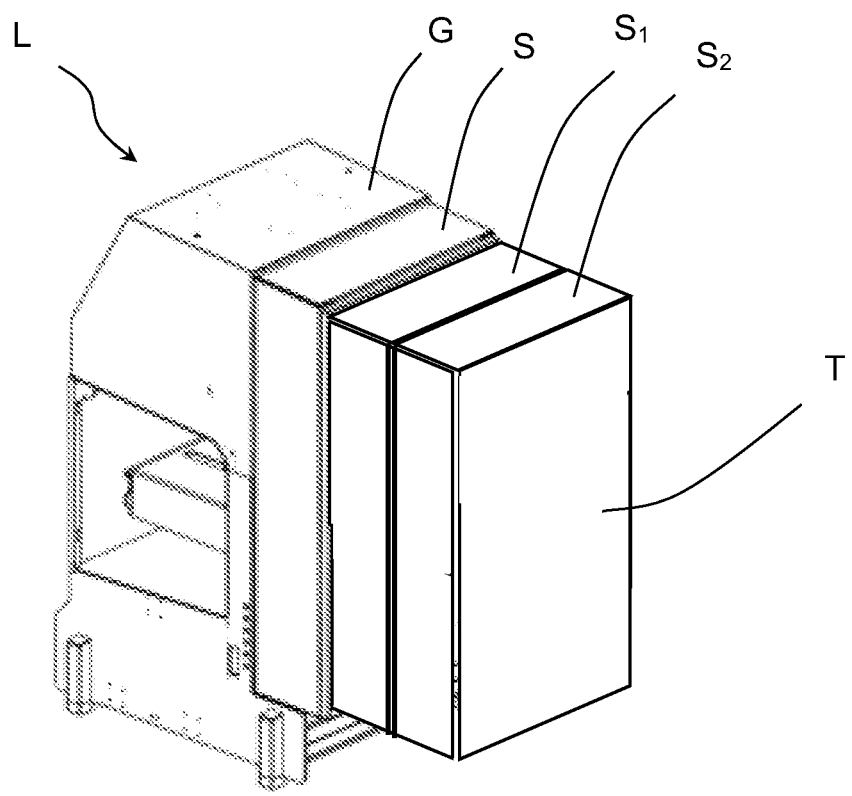
FIG. 5 shows an arrangement having a plurality of switch cabinets.

FIG. 5 shows a simplified representation of another embodiment within the scope of the present invention. A device housing G has been extended by a switch cabinet S in the manner already described. The arrangement composed of device housing G and switch cabinet S has been supplemented by two additional switch cabinets $S_1$ and $S_2$. In the manner according to the invention, the switch cabinet S, by means of the wall W thereof, closes off the housing opening $O_G$ of the device housing G (although the covered openings or walls cannot be seen in FIG. 5). The added switch cabinet $S_1$ closes off, by means of its rear wall, the switch cabinet opening of switch cabinet S in the manner of the invention, while the additionally added switch cabinet $S_2$ in turn closes off the switch cabinet opening of the first switch cabinet $S_1$. The switch cabinet $S_2$ is closed off at the front side thereof by a switch cabinet door T. All the switch cabinets are pivotable relative to one another about a vertical pivot axis not shown in detail such that the switch cabinet interiors of the individual switch cabinets, or the housing interior I of the device housing, become accessible by pivoting aside the switch cabinets in front of the respective opening.

As used herein, whether in the above description or the following claims, the terms "comprising," "including," "carrying," "having," "containing," "involving," and the like are to be understood to be open-ended, that is, to mean including but not limited to. Also, it should be understood that the terms "about," "substantially," and like terms used herein when referring to a dimension or characteristic of a component indicate that the described dimension/characteristic is not a strict boundary or parameter and does not exclude variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary the least significant digit.

Any use of ordinal terms such as "first," "second," "third," etc., in the following claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term). Rather than using an ordinal term to distinguish between commonly named elements, a particular one of a number of elements may be called out in the following claims as a "respective one" of the elements and thereafter referred to as "that respective one" of the elements.

The term "each" may be used in the following claims for convenience in describing characteristics or features of multiple elements, and any such use of the term "each" is in the inclusive sense unless specifically stated otherwise. For example, if a claim defines two or more elements as "each" having a characteristic or feature, the use of the term "each" is not intended to exclude from the claim scope a situation having a third one of the elements which does not have the defined characteristic or feature.

The above-described preferred embodiments are intended to illustrate the principles of the invention, but not to limit the scope of the invention. Various other embodiments and modifications to these preferred embodiments may be made by those skilled in the art without departing from the scope of the present invention. For example, in some instances, one or more features disclosed in connection with one embodiment can be used alone or in combination with one or more features of one or more other embodiments. More generally, the various features described herein may be used in any working combination.

LIST OF REFERENCE CHARACTERS

A, A' Pivot axis
D Seal
G Device housing
I Housing interior
L Arrangement
M Switch cabinet interior
$O_G$ Housing opening
$O_S$ Switch cabinet opening
R X-ray inspection device
S, $S_1$, $S_2$ . . . Switch cabinet
$S_O$ Open position
$S_X$ Closed position
T Switch cabinet door
Z Depth direction
W Wall of the switch cabinet

The invention claimed is:

1. An apparatus comprising:
(a) a device housing adapted to contain a device or machine component to which a fluid flow is applied, the device housing including a housing opening;
(b) a first switch cabinet adapted to accommodate a first electrical component of the device or machine component, the first switch cabinet including a first switch cabinet interior delimited in part by a first switch cabinet wall and the first switch cabinet wall being movable between a first switch cabinet wall closed position and a first switch cabinet wall open position relative to the device housing; and
(c) wherein the first switch cabinet wall in the first switch cabinet wall closed position covers the housing opening so as to seal the housing opening along the periphery of the housing opening against ingress of fluids, and wherein the first switch cabinet wall in the first switch cabinet wall open position is separated from the housing opening to expose the housing opening.

2. The apparatus of claim 1 wherein the first switch cabinet wall pivots about a pivot axis as the first switch cabinet wall is moved between the first switch cabinet wall closed position and the first switch cabinet wall open position.

3. The apparatus of claim 1 wherein the first switch cabinet wall is shifted in a movement parallel to the housing opening as the first switch cabinet wall is moved between the first switch cabinet wall closed position and the first switch cabinet wall open position.

4. The apparatus of claim 1 wherein the first switch cabinet wall is shifted in a movement perpendicular to the housing opening as the first switch cabinet wall is moved between the first switch cabinet wall closed position and the first switch cabinet wall open position.

5. The apparatus of claim 1 wherein the device housing includes a guide structure for guiding movement of the first switch cabinet as the first switch cabinet wall is moved between the first switch cabinet wall closed position and the first switch cabinet wall open position.

6. The apparatus of claim 1 further including a second switch cabinet adapted to accommodate a second electrical component of the device or machine component, the second switch cabinet including a second switch cabinet interior delimited in part by a second switch cabinet wall and the second switch cabinet wall being movable between a second switch cabinet wall closed position and a second switch cabinet wall open position relative to the first switch cabinet.

7. The apparatus of claim 6 wherein the second switch cabinet wall in the second switch cabinet wall closed position covers a first switch cabinet opening of the first switch cabinet so as to seal a periphery of the first switch cabinet opening against ingress of fluids.

8. The apparatus of claim 1 wherein the device housing contains therein one or more tubes or one or more containers for receiving the fluid flow.

9. The apparatus of claim 1 wherein:
(a) the first switch cabinet includes a first switch cabinet opening located opposite to the first switch cabinet wall;
(b) the first switch cabinet is removable from the device housing;
(c) the apparatus includes a system door adapted to be mounted alternatively on the first switch cabinet and, after the first switch cabinet is removed from the device housing, on the device housing;
(d) when mounted on the first switch cabinet in a first switch cabinet closed position the system door is adapted to cover the first switch cabinet opening; and
(e) when mounted on the device housing in a device housing closed position the system door is adapted to cover the housing opening.

10. The apparatus of claim 9 wherein the device housing and the first switch cabinet each include a respective cover mounting structure adapted to receive the system door so that the system door can be readily transferred from the first switch cabinet opening to the housing opening or vice versa.

11. The apparatus of claim 1 wherein the device opening is delimited by an edge lying in a plane.

12. The apparatus of claim 1 further including a seal element acting between the first switch cabinet wall and the housing opening around an entire periphery of the housing opening when the first switch cabinet wall is in the first switch cabinet wall closed position to achieve a predetermined housing protection class, the predetermined housing protection class defining a level of protection for escape or penetration of dirt, dust, liquids or gases from or into, respectively, the device housing through the housing opening.

13. The apparatus of claim 12 wherein the device or machine component includes a component of a scale.

14. The apparatus of claim 12 wherein the device or machine component includes a component of an inspection or monitoring device.

15. The apparatus of claim 12 wherein the device or machine component includes a component of an X-Ray inspection device and the fluid flow comprises a coolant fluid for the component of the X-Ray inspection device.

* * * * *